(12) United States Patent
Rodenbeck et al.

(10) Patent No.: US 6,535,136 B1
(45) Date of Patent: Mar. 18, 2003

(54) PROXIMITY CARD DETECTION SYSTEM

(75) Inventors: Robert Wilmer Rodenbeck, Indianapolis, IN (US); Roger Keith Russell, Indianapolis, IN (US); Michael Lee Long, Fishers, IN (US)

(73) Assignee: Best Lock Corporation, Indianapolis, IN (US)

( * ) Notice: Subject to any disclaimer, the term of this patent is extended or adjusted under 35 U.S.C. 154(b) by 0 days.

(21) Appl. No.: 09/243,772

(22) Filed: Feb. 3, 1999

Related U.S. Application Data

(60) Provisional application No. 60/076,024, filed on Feb. 26, 1998.

(51) Int. Cl.[7] .............................................. G08B 21/00
(52) U.S. Cl. ..................... 340/686.6; 340/542; 340/5.2; 235/382; 380/277; 380/30; 380/52; 70/278.1
(58) Field of Search .......................... 340/686.6, 686.1, 340/505, 540, 528, 542, 825.69, 5.21, 10.1, 539, 534, 535, 5.2; 235/380, 382; 380/277, 281–285, 30, 44, 52; 70/278.1, 280

(56) References Cited

U.S. PATENT DOCUMENTS

| | | | | |
|---|---|---|---|---|
| 3,976,974 A | * | 8/1976 | Hinohara et al. | 340/540 |
| 4,645,914 A | * | 2/1987 | Hiraishi | 235/380 |
| 4,730,188 A | | 3/1988 | Milheiser | |
| 4,783,823 A | * | 11/1988 | Tesaki et al. | 382/4 |
| 4,837,822 A | * | 6/1989 | Crosley et al. | 380/23 |
| 5,099,113 A | * | 3/1992 | Oi et al. | 250/214 B |
| 5,198,643 A | * | 3/1993 | Miron et al. | 235/382 |
| 5,305,459 A | * | 4/1994 | Rydel | 395/750 |
| 5,437,174 A | * | 8/1995 | Aydin | 70/150 |
| 5,473,236 A | | 12/1995 | Frolov | |
| 5,796,827 A | * | 8/1998 | Coppersmith et al. | 380/9 |
| 5,902,998 A | * | 5/1999 | Olson et al. | 235/462.23 |
| 5,977,878 A | * | 11/1999 | Lang | 250/221 |
| 6,011,320 A | * | 1/2000 | Miyamoto et al. | 307/10.2 |
| 6,084,524 A | * | 7/2000 | Sato | 250/222.2 |
| 6,178,259 B1 | * | 1/2001 | Harris | 382/170 |

OTHER PUBLICATIONS

*Electronic Engineering* (UK), vol. 69, No. 845, "Charge Transfer Sensor Technology Provides A New Family Of Sensors", by Hal Phillip, May, 1997, pp. 28–31.
"Charge–Transfer Capacitance Sensor IC", pp. 1–19, published by Quantum Research Group Ltd., 1997.
"Proximity Detector", pp. 236–242, published by the Institute of Electrical and Electronics Engineers, Inc. 1997.
"Proximity Detector", pp. 66–69, published by the Institute of Electrical and Electronics Engineers, Inc. 1997.
"Microchip PIC16C6X 8–Bit CMOS Microcontrollers", pp. 1, 2, 11, 15, 52, 54 and 56, published by Microchip Technology, Inc., 1997.

* cited by examiner

*Primary Examiner*—Nina Tong
(74) *Attorney, Agent, or Firm*—Barnes & Thornburg

(57) ABSTRACT

A security system comprises a card containing access information, a reader for reading the card, a power source, a locking mechanism, and a first circuit for operating the locking mechanism. The power source is coupled to the first circuit to provide power to the first circuit. The power source is also coupled to a wake-up circuit to provide power to the wake-up circuit. The wake-up circuit detects the presence of an object and enables the reader to ascertain whether the object is the card. A method for operating the security system comprises first determining that electromagnetic energy is not being detected by the wake-up circuit, then determining that electromagnetic energy is being detected by the wake-up circuit, then determining that electromagnetic energy is not being detected by the wake-up circuit, and then ascertaining whether the object is the card.

57 Claims, 6 Drawing Sheets

PROXIMITY CARD DETECTION SYSTEM

This application claims the benefit of 119(c) for the Provisional Application 60/076,024 filed Feb. 26, 1998.

FIELD OF THE INVENTION

This invention relates to locking mechanisms for doors, and particularly to locking mechanisms that are unlocked using proximity cards and proximity card detection systems. More particularly, the present invention relates to apparatus and methods for detecting proximity cards under low levels of current consumption, then activating higher current-draw assemblies.

DISCLOSURE OF THE INVENTION

According to one aspect of the present invention, a security system comprises a card containing access information, a reader for reading the card, a power source, a locking mechanism, and a first circuit for operating the locking mechanism. The power source is coupled to the first circuit to provide power to the first circuit. The power source is also coupled to a wake-up circuit to provide power to the wake-up circuit. The wake-up circuit detects the presence of an object and enables the reader to ascertain whether the object is the card.

Illustratively according to this aspect of the invention, the power source is coupled to the reader via a switch providing a power supply path and a control line. The power supply path is coupled to the power source and to the reader and the control line is coupled to the wake-up circuit. The wake-up circuit controls the power supply path through the control line to enable the power supply path to supply power to the reader upon detection by the wake-up circuit of the object.

Further illustratively according to this aspect of the invention, the wake-up circuit further comprises a circuit for producing a signal for controlling the switch.

Additionally illustratively according to this aspect of the invention, the wake-up circuit comprises a circuit for determining that electromagnetic energy was first absent, then determining that the electromagnetic energy was present, then determining that the electromagnetic energy was absent again before enabling the reader to ascertain whether the object is the card. The signal enables the power supply path to the reader after the wake-up circuit has determined first the absence, then the presence, then the absence, of the electromagnetic energy.

Illustratively according to this aspect of the invention, the wake-up circuit comprise a circuit for determining that the electromagnetic energy was first absent, then within a first period of time after determining that the electromagnetic energy was first absent determining that the electromagnetic energy was present, then within a second period of time after determining that the electromagnetic energy was present, which second period of time may be of the same duration or a different duration than the first period of time, determining that the electromagnetic energy was absent again before enabling the reader to ascertain whether the object is the card.

Further illustratively according to this aspect of the invention, the wake-up circuit comprises an emitter of electromagnetic energy and a detector of electromagnetic energy.

Additionally illustratively according to this aspect of the invention, the electromagnetic energy emitter and electromagnetic energy detector comprise an infrared emitter and infrared detector, respectively.

According to another aspect of the invention, a method is provided for operating a security system comprising a card containing access information, a locking mechanism, a first circuit for operating the locking mechanism, and a second circuit for detecting the presence of an object and ascertaining whether the object is the card. The method comprises first determining that electromagnetic energy is not being detected by the second circuit, then determining that electromagnetic energy is being detected by the second circuit, then determining that electromagnetic energy is not being detected by the second circuit, and then ascertaining whether the object is the card.

According to this aspect of the invention, the steps of first determining that electromagnetic energy is not being detected by the second circuit, then determining that electromagnetic energy is being detected by the second circuit, then determining that electromagnetic energy is not being detected by the second circuit comprise first determining that electromagnetic energy is not being detected by the second circuit, then within a first period of time after determining that electromagnetic energy is not being detected by the second circuit determining that electromagnetic energy is being detected by the second circuit, then within a second period of time after determining that the electromagnetic energy is being detected by the second circuit, which second period of time may be of the same duration or a different duration than the first period of time, determining that electromagnetic energy is not being detected by the second circuit.

Additionally illustratively according to this aspect of the invention, the security system further comprises a power source coupled to the reader via a switch providing a power supply path and a control line. The power supply path is coupled to the power source and to the reader and the control line is coupled to the second circuit. The method further comprises controlling the power supply path through the control line to enable the power supply path to supply power to the reader upon detection by the second circuit of the object.

Additionally illustratively according to this aspect of the invention, the second circuit comprises a third circuit for detecting the presence of the object and a reader for ascertaining whether the object is the card. The steps of first determining that electromagnetic energy is not being detected by the second circuit, then determining that electromagnetic energy is being detected by the second circuit, then determining that electromagnetic energy is not being detected by the second circuit comprise first determining that electromagnetic energy is not being detected by the third circuit, then determining that electromagnetic energy is being detected by the third circuit, then determining that electromagnetic energy is not being detected by the third circuit, respectively. The step of ascertaining whether the object is the card comprises ascertaining with the reader whether the object is the card.

Further illustratively according to this aspect of the invention, the third circuit comprises an emitter of electromagnetic energy and a detector of electromagnetic energy. The steps of first determining that electromagnetic energy is not being detected by the third circuit, then determining that electromagnetic energy is being detected by the third circuit, then determining that electromagnetic energy is not being detected by the third circuit comprise the steps of first detecting the absence of electromagnetic energy using the detector, then emitting electromagnetic energy using the emitter and simultaneously detecting the emitted electromagnetic energy using the detector, and then detecting the absence of electromagnetic energy using the detector, respectively.

Additionally according to this aspect of the invention, the steps of first determining that electromagnetic energy is not being detected by the third circuit, then determining that electromagnetic energy is being detected by the third circuit, then determining that electromagnetic energy is not being detected by the third circuit comprise the steps of first determining that infrared energy is not being detected by the third circuit, then emitting infrared energy using the emitter and simultaneously determining that infrared energy is being detected by the third circuit, then determining that infrared energy is not being detected by the third circuit.

According to another aspect of the invention, an access system for controlling access to a location secured by a locking mechanism comprises a power source, a wake-up circuit coupled to the power source to detect the presence of a proximity card, and an access control circuit including a proximity card reader coupled to the wake-up circuit.

Illustratively according to this aspect of the invention, the access control circuit is coupled to the wake-up circuit by a switch.

Further illustratively according to this aspect of the invention, the switch comprises a software-controlled switch.

Additionally illustratively according to this aspect of the invention, the wake-up circuit includes an emitter and a detector.

Illustratively according to this aspect of the invention, the emitter and detector comprise an infrared energy emitter and infrared energy detector.

Illustratively according to this aspect of the invention, the emitter and detector comprise an emitter and detector of ambient infrared energy for determining if a proximity card is present.

Alternatively illustratively according to this aspect of the invention, the emitter and detector comprise an ultrasonic energy emitter and ultrasonic energy detector for determining if a proximity card is present.

Alternatively illustratively according to this aspect of the invention, the emitter and detector comprise a magnetic field emitter and a magnetic field detector.

Alternatively illustratively according to this aspect of the invention, the emitter and detector comprise an emitter and detector for detecting electrical coils of a proximity card for determining if a proximity card is present.

Further illustratively according to this aspect of the invention, the wake-up circuit includes a sensor to sense changes in capacitance for determining if a proximity card is present.

Additionally illustratively according to this aspect of the invention, the wake-up circuit includes a sensor to sense changes in inductance for determining if a proximity card is present.

Illustratively according to this aspect of the invention, the wake-up circuit includes a sensor to sense changes in electrical charge for determining if a proximity card is present.

According to another aspect of the invention, a method for controlling access to a location secured by a locking mechanism comprises the steps of detecting a proximity card using a wake-up circuit, transmitting a wake-up signal to an access control circuit, reading card data from the proximity card, and unlocking the locking mechanism when valid card data is read.

Illustratively according to this aspect of the invention, the method further comprises the step of sending card data to the access control circuit.

Further illustratively according to this aspect of the invention, the step of sending card data to the access control circuit comprises sending card data to the access control circuit via a card data signal.

Additionally illustratively according to this aspect of the invention, the method further comprises the step of matching the card data to card data stored within the access control circuit.

Illustratively according to this aspect of the invention, the step of transmitting a wake-up signal to an access control circuit comprises the step of transmitting a wake-up signal to an access control circuit signaling the access control circuit that a proximity card has been detected.

According to another aspect of the invention, an access system for controlling access to a location secured by a locking mechanism comprises a power source, a wake-up switch coupled to the power source to indicate the presence of a proximity card, and an access control circuit including a proximity card reader coupled to the wake-up switch.

According to another aspect of the invention, a method for controlling access to a location secured by a locking mechanism comprises the steps of detecting the change of state of a switch, transmitting a wake-up signal to an access control circuit, reading card data from a proximity card, and unlocking the locking mechanism when valid card data is read.

BRIEF DESCRIPTION OF THE DRAWINGS

The invention may best be understood by referring to the following detailed description and accompanying drawings which illustrate the invention.

DETAILED DESCRIPTION OF AN ILLUSTRATIVE EMBODIMENT

In the detailed description that follows, certain integrated circuits and other components are identified by particular types, component values and sources. In some cases, terminal names and pin numbers for these specifically identified types, components and sources are noted. This should not be interpreted to mean that the identified types, components and/or sources are the only types, components and/or sources available that will perform the described functions. Other circuit types, component values and types, and component sources typically are available which will perform the described functions. The terminal names, pin numbers, and the like, of such other circuit types; components and sources may or may not be the same as those indicated for the specific circuits and components identified in this application.

Figure 1:
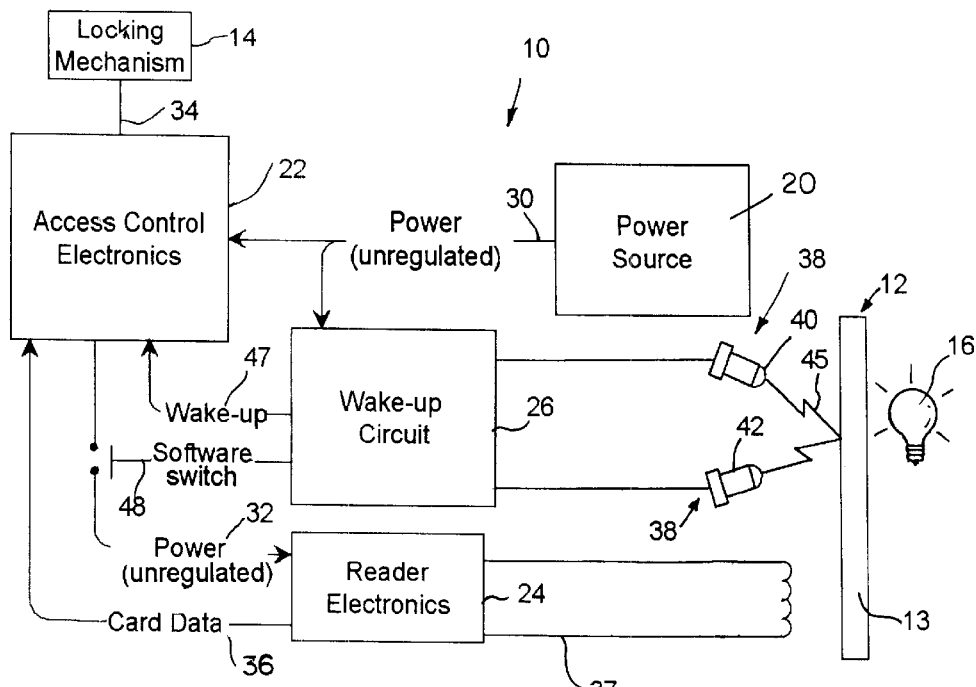
FIG. 1 illustrates a block diagram of a proximity card detection system according to the present invention.

Referring to FIG. 1, a proximity card detection system 10 is used to detect the presence of a proximity card 12, read card data 13 from the proximity card 12, and unlock a locking mechanism 14 such as a door lock if the data 13 indicates that access should be provided. The proximity card detection system 10 includes a power source 20, access control electronics 22, reader electronics 24, and a wake-up circuit 26. To keep power consumption low and extend the life of the power source 20, the proximity card detection system 10 uses the wake-up circuit 26 to keep the reader electronics 24 and the access control electronics 22 powered down until the proximity card 12 is detected. After the proximity card 12 is detected by the wake-up circuit 26, the reader electronics. 24 and access control electronics 22 get powered up to determine if the locking mechanism 14 should be unlocked. In the illustrated embodiment, the proximity card detection system according to the invention is a battery-powered, stand-alone system that includes a wake-up circuit to minimize power consumption. In addition, in the illustrated embodiment, the proximity card detection system uses an "absence-presence-absence" algorithm (as discussed below) to prevent ambient light 16 from falsely triggering the wake-up circuit 26.

As illustrated in FIG. 1, the power source 20 provides unregulated power 30 to the wake-up circuit 26 and the access control electronics 22. The power source 20 also provides regulated power 32 through the access control electronics 22 to the reader electronics 24. Illustratively, the power source 20 includes four (4) AA alkaline batteries to provide approximately six (6) volts to the access control electronics 22 and wake-up circuit 26. However, any power source including, but not limited to, hard-wired AC or DC regulated or unregulated power may be used to power the proximity card detection system of the current invention.

The access control electronics 22 can be used to unlock and/or re-lock the locking mechanism 14 under various conditions. For example, access control electronics 22 can be configured to lock and/or re-lock the locking mechanism 14 at specific times of day (i.e., unlock at 8:00 a.m. and re-lock at 5:00 p.m. every day) independent of the detecting or reading of a proximity card 12. The access control electronics 22 can also operate in a "passage mode" condition where the locking mechanism 14 is unlocked after a valid proximity card 12 has been detected and read (as discussed below) and then re-locked automatically after a predetermined amount of time has passed. The access control electronics 22 can operate in either of these conditions, in some combination of these two conditions, or in a variety of other conditions.

When the access control electronics 22 operate in the "passage mode" condition, two conditions must be met before the access control electronics 22 send an unlock/re-lock signal 34 to the locking mechanism 14 to unlock the locking mechanism 14 for the predetermined amount of time before automatically re-locking the locking mechanism 14. The first condition that must be met is that the wake-up circuit 26 must detect the proximity card 12 (as described in more detail below) and transmit a wake-up signal 47 to the access control electronics 22 telling the access control electronics 22 that a proximity card 12 has been detected. This, in effect, enables (or activates) the access control electronics 22 (as discussed below). Typically, access control electronics of the type contemplated by the invention consume a moderate amount of power when activated and therefore, to conserve power, it is important to keep the access control electronics powered down until they are needed. Once enabled, the second condition that must be met is that the reader electronics 24 must read the card data 13 from the proximity card 12 and send this card data 13 to the access control electronics 22 via a card-data signal 36. The card-data signal 36 must match a set of valid card data that is stored within the access control electronics 22 for the locking mechanism 14 to be unlocked. Thus, only if both conditions are met (i.e., the proximity card 12 is detected and the card data 13 is valid) will the access control electronics 22 unlock the locking mechanism 14 by sending the unlock/re-lock signal 34 to the locking mechanism 14.

The reader electronics 24 are used to read the card data 13 that are stored on the proximity card 12 and transfer the card data 13 to the access control panel 22 via the card-data signal 36. Illustratively, the reader electronics 24 include a read head 37 that is designed to read the card data 13 that is written via a write head onto the proximity card 12. The reader electronics 24 are designed to read the card data 13 only after the wake-up circuit 26 closes a software-controlled switch 48, illustrated diagrammatically in FIG. 1, that permits regulated power 32 to flow to the reader electronics 24. After the reader electronics 24 are powered up and the card data 13 is read by read head 37, the reader electronics 24 transmit the card data 13 to the access control electronics 22 via the card-data signal 36. Typically, reader electronics like those illustrated in FIG. 1 consume a moderate amount of power when reading a proximity card and therefore, to conserve power, it is important to keep the reader electronics powered down until a proximity card is detected. Although the reader electronics just described illustrate an inductive coil read head for reading the proximity card data, any type of reader device could be used within the scope of this invention.

The wake-up circuit 26 is used to detect the presence of a proximity card 12, to enable the access control electronics 22, and to supply power to the reader electronics 24 when appropriate. To detect the presence of a proximity card 12, the wake-up circuit 26 includes a detection device 38. The detection device 38 illustratively includes an emitter 40 and a detector 42. In the illustrated embodiment, the emitter 40 and detector 42 emit and detect infrared energy. However, any suitable type of detection device, including but not limited to emitters and/or detectors of passive infrared energy, ultrasonic energy, passive magnetic fields (detecting the coils of the card using a magnetic sensor), or sensors combined with electronics to sense changes in capacitance, inductance, or electrical charge, can be used for determining if a proximity card is present.

The wake-up circuit 26 could detect the presence of a proximity card 12 by having the emitter 40 emit infrared energy 45 outwardly away from the proximity card detection system 10 while monitoring the detector 42 for detection of infrared energy. In such a scenario, as illustrated in FIG. 1, if a proximity card 12 (or other reflective object) is present, energy 45 will be reflected back towards the proximity card detection system 10 and the detector 42 will detect the reflected infrared energy 45. That causes the wake-up circuit 26 to send the wake-up signal 47 to the access control electronics 22 indicating that a proximity card 12 or other reflective object is present. If a proximity card 12 or other reflective object is not present, or if the proximity card 12 is too far away, the infrared energy 45 will not be reflected and will not be detected by detector 42. Thus, the wake-up signal 47 would not be sent to the access control electronics 22.

Although such a detection system (requiring only a "presence" of infrared energy) could be used with the wake-up circuit of the present invention, such a system does not address the situation where the ambient light 16 contains infrared energy. If, in the system just described, the ambient light 16 contained sufficient infrared energy, the detector 42 would detect the infrared energy in the ambient light 16 as well as the energy 45 being reflected by the proximity card 12 or other reflective object. In this case, even if a proximity card 12 or other reflective object were not present, the wake-up circuit 26 would conclude that a proximity card 12 were present because infrared energy would be detected from the ambient light 16. The wake-up circuit 26 would then send the wake-up signal 47 which would unnecessarily deplete the power source 20 because, in fact, no card 12 is present. Thus, the illustrated embodiment contemplates an "absence-presence-absence" algorithm (as described below) which reduces the likelihood that ambient light 16 that emits infrared energy will be misinterpreted as a proximity card being present.

Referring now to FIGS. 2–5, under normal operating conditions, the proximity card detection system 10 of FIG. 1 consumes varying amounts of electrical current based on the particular function that the proximity card detection system 10 is performing. These particular functions are illustrated diagrammatically in FIGS. 3 and 4 which illustrates software for controlling the wake-up circuit 26. Both the access control electronics 22 and the reader electronics 24 are controlled to an extent by the wake-up circuit 26.

Figure 2:
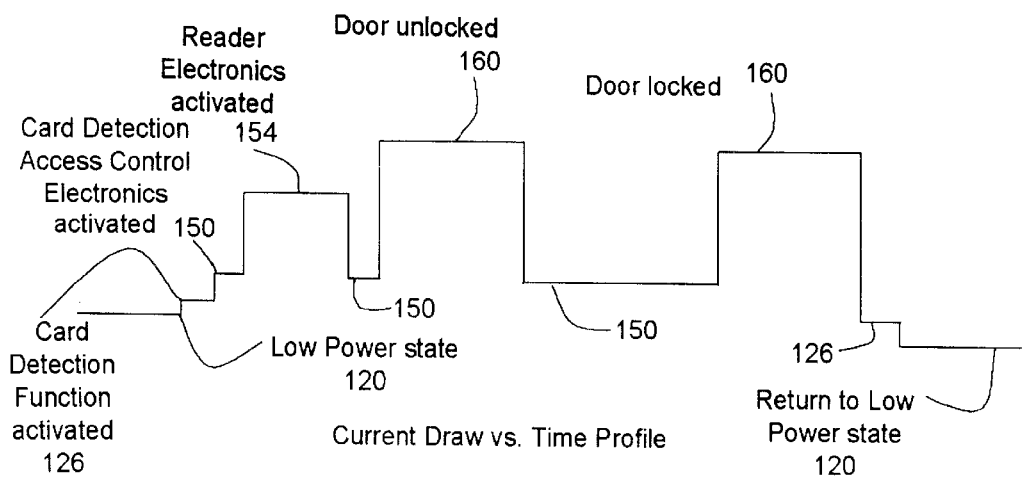
FIG. 2 illustrates the electrical current consumption of the proximity card detection system illustrated in FIG. 1 under normal operating conditions.
Figure 3:
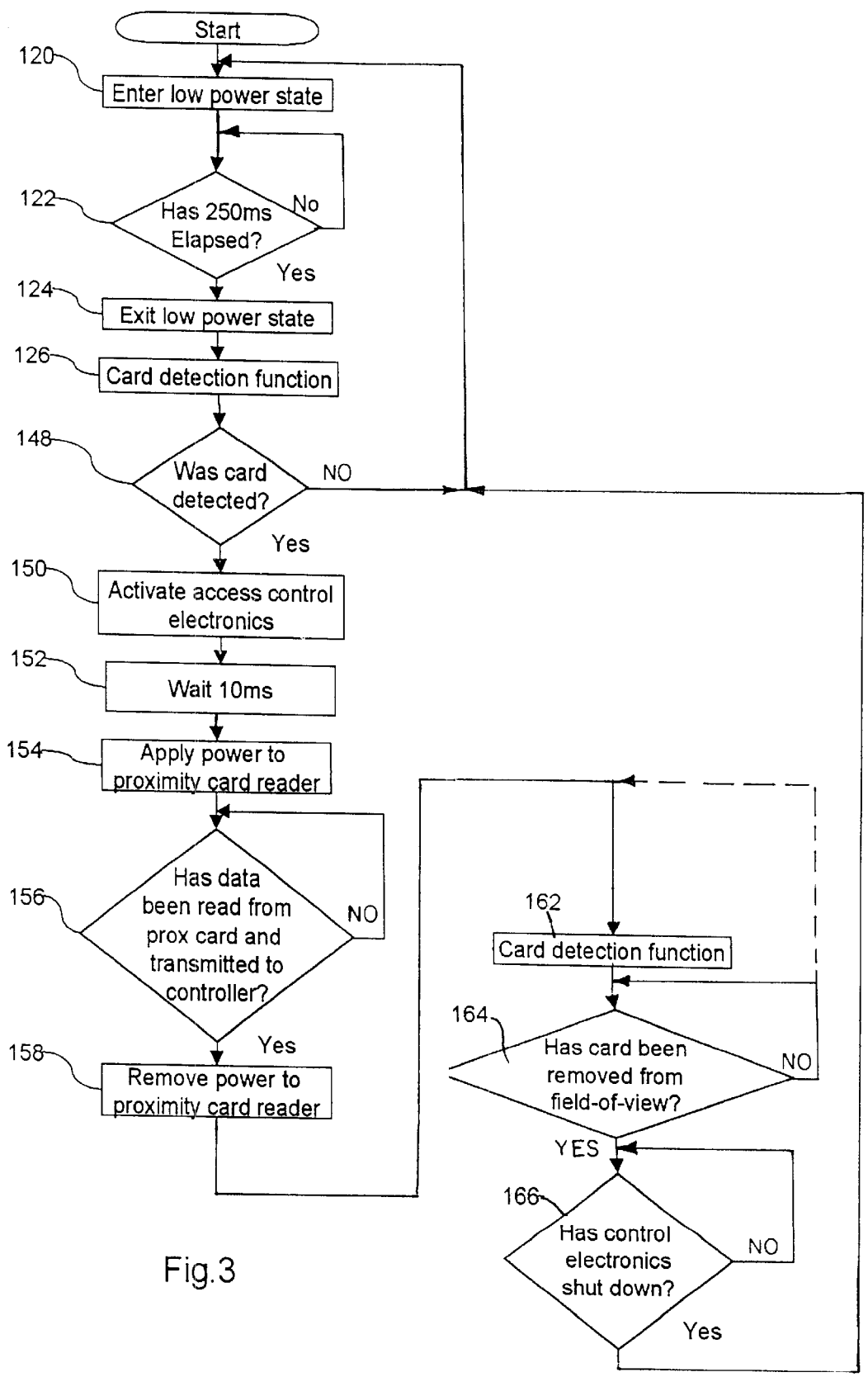
FIG. 3 illustrates a flow chart of a wake-up function embodied in the system illustrated/in FIG. 1.
Figure 4:
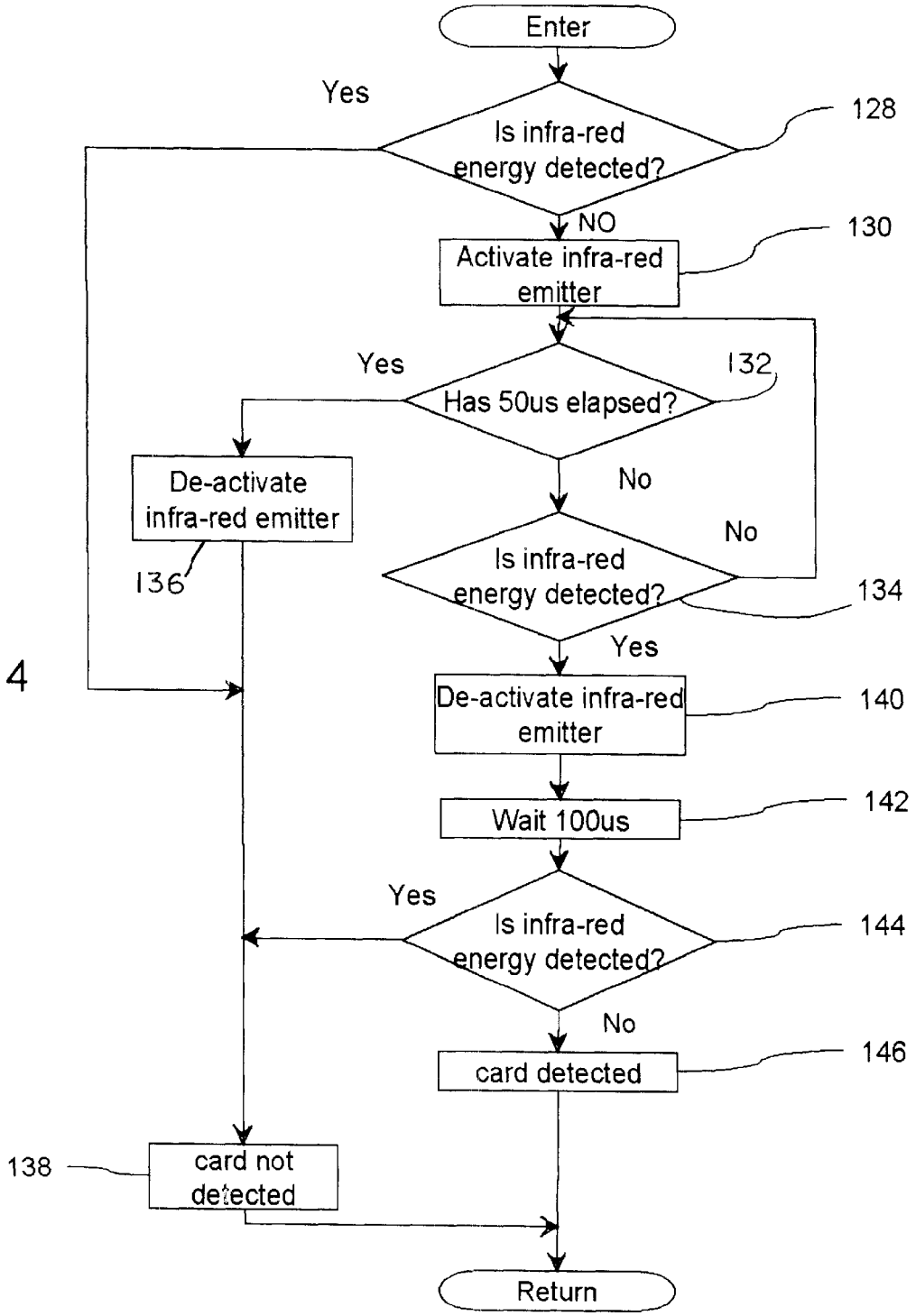
FIG. 4 illustrates a more detailed flow chart of the card detection function illustrated in FIG. 3.

To describe FIGS. 3–4, two examples will be used to step through the wake-up function illustrated in these drawings. In the first example, the wake-up function will be described based on the assumption that the ambient light 16 does not contain sufficient infrared energy to activate wake-up circuit 26. In the second example, it is assumed that the light source 16 does contain sufficient infrared energy to activate wake-up circuit 26. It is important to note that these examples, as well as FIGS. 2–4, illustrate the invention and are not intended to limit the invention except as specifically described in the claims.

Referring now to the first example and FIGS. 2 and 3, the proximity card detection system 10 begins in a low-power state as illustrated at block 120 in FIG. 3. In the low-power state, the wake-up circuit 26, the reader electronics 24, and the access control electronics 22 are effectively powered down. Referring to FIG. 2, this relates to the electrical current consumption of the proximity card detection system 10 being at a low-power level 120 which is the initial electrical current draw of the proximity card detection system 10. Referring back to FIG. 3, the proximity card detection system 10 remains in the low-power state for 250 milliseconds as illustrated by block 122. The proximity card detection system 10 then exits the low-power state as illustrated by block 124 and enters a card detection function as illustrated by block 126. As illustrated in FIG. 2, when the card detection function 126 is activated, additional power is used because the emitter 40 and detector 42 are activated to determine whether a proximity card 12 is present. This results in the electrical current consumption moving from the low-power level 120, illustrated in FIG. 2, to a card-detection-function level 126.

The card detection function illustrated by block 126 in FIG. 3 is detailed in FIG. 4. The card detection function 126 involves an algorithm that requires an "absence, then presence, and then absence" of infrared energy before indicating that a card 12 or other object is present. This "absence-presence-absence" algorithm helps reduce the likelihood of false detections of a proximity card being present because the "absence-presence-absence" algorithm requires more than a single "presence" of infrared energy before indicating that a proximity card 12 or other reflective object is present. The "absence-presence-absence" algorithm prevents wake-up circuit 26 from unnecessarily sending the wake-up signal 47 to the access control electronics 22 when ambient infrared light 16 is present (thereby unnecessarily depleting the power source 20). The absence-presence-absence algorithm will detect a proximity card 12 or other reflective object whether or not the ambient light 16 contains sufficient infrared energy.

When the ambient light 16 does not contain sufficient infrared light to activate wake-up circuit 26, the card detection function 126 first determines if sufficient infrared energy has been detected by detector 42 as illustrated by block 128 in FIG. 4. In other words, block 128 is looking for the first "absence" of infrared energy, as required by the "absence-presence-absence" algorithm. Because the emitter 40 has not yet been turned on, no infrared energy from emitter 40 will be detected. In addition, the ambient light 16, in this example, does not contain sufficient infrared energy to activate wake-up circuit 26. Thus, under these conditions, no infrared energy will be detected at block 128 in FIG. 4 and the first "absence" requirement of the "absence-presence-absence" algorithm is satisfied.

If insufficient infrared energy is detected at block 128, the infrared emitter 40 is turned on as illustrated by block 130 in FIG. 4 to permit detection of the "presence" of infrared energy. With the emitter 40 activated, the infrared energy 45 is radiated as illustrated in FIG. 1. If a proximity card 12 or other reflective object is presented in front of the proximity card detection system 10, the infrared energy 45 will be reflected back towards the detector 42 as illustrated in FIG. 1. However, if no proximity card 12 is present, the infrared energy 45 will not be reflected. Thus, the card detection function 126 is probing for a "presence" of infrared energy that is the direct result of the infrared energy 45 from the emitter 40 being reflected by the proximity card 12 back towards the detector 42.

The emitter 40 remains activated for approximately 50 microseconds ($\mu$s) as illustrated by block 132. If, after the emitter 40 is turned on, 50 $\mu$s have not elapsed, the software checks to see if infrared energy 45 has been detected by the detector 42 as illustrated by block 134. If no proximity card 12 or other object is present, the infrared energy 45 will not be reflected back towards the detector 42 and the detector 42 will not detect infrared energy. In this case, after the 50 $\mu$s of block 132 elapse, the emitter 40 is deactivated as illustrated by block 136 and the card detection function 126 returns a signal, as illustrated by block 138, that no proximity card 12 or other reflective object was detected. If, however, a proximity card 12 or other object is presented in front of the proximity card detection system 10 before the 50 microseconds elapse, the infrared energy 45 will be reflected back towards the detector 42 and detected at block 134. In this case, the "presence" requirement of the "absence-presence-absence" algorithm will be satisfied and the card detection function 126 continues with a "yes" exiting from block 134.

After the wake-up circuit 26 has detected an absence and then a presence of infrared energy as just described, the wake-up circuit 26 then probes for the final "absence" requirement to complete the "absence-presence-absence" algorithm. To do this, the wake-up circuit 26 first deactivates (or turns off) the emitter 40 as illustrated by block 140 in FIG. 4. After the infrared emitter 40 is deactivated, there is a 100 microsecond delay as illustrated by block 142 in FIG. 4. The 100 μs delay must elapse before the detector 42 is turned on to see if infrared energy is detected as illustrated by block 144. With the infrared emitter 40 deactivated, no infrared energy 45 emitted from emitter 40 can be reflected back towards the detector 42 and the 100 μs delay helps to ensure that this is the case. Thus, the final "absence" requirement will be met. As a result, under these conditions where the emitter 40 is off and the ambient light 16 does not contain sufficient infrared energy, no infrared energy will be detected, and the card detection function 126 will return a signal to the main routine illustrated in FIG. 3 that a card 12 or other object has been detected as illustrated by block 146.

From this point, the wake-up circuit 26 uses the "card detected" value from block 146 (because the absence-presence-absence criterion has been met) to answer the inquiry of block 148 in FIG. 3. Because the absence-presence-absence requirement of FIG. 4 was satisfied and the card detection function 126 returned a signal indicating that a card 12 or other object was detected, block 148 in FIG. 3 returns a "YES" and the walk-up function illustrated in FIG. 3 continues. Of course, if the absence-presence-absence requirement had not been satisfied, the card detection function 126 would have returned a signal indicating that a proximity card 12 was not detected and block 148 of FIG. 3 would return a "NO." If this occurred, the wake-up circuit 26 would re-enter the low power state as illustrated by block 120 and the process (or loop) just described would continue until a proximity card 12 or other object was detected.

Assuming that a proximity card 12 was detected and block 148 returned a "YES," the wake-up circuit 26 then activates the access control electronics 22 as illustrated by block 150. This results in another increase in electrical current consumption as illustrated by the jump from the card-detection-function level 126, illustrated in FIG. 2, to a card-detected level 150 because the access control electronics 22 are now waiting to receive and process the card-data signal 36 from the reader electronics 36 and this requires additional power. Referring back to FIG. 3, once the access control electronics 22 are enabled as illustrated by block 150, there is a 10 millisecond delay as illustrated by block 152. The 10 millisecond delay permits the unregulated power 30 going to the access control electronics 22 to stabilize before the card 12 is read.

After the 10 millisecond delay, regulated power 32 is applied to the reader electronics 24 as illustrated by block 154. This is illustrated diagrammatically in FIG. 1 as software-controlled switch 48 being closed to provide regulated power 32 to the reader electronics 24. This closing of the software-controlled switch 48 increases the electrical current consumption of the proximity card detection system 10 from the card-detected level 150 to a reader-electronics-activated level 154, as illustrated in FIG. 2. The power continues to be applied to the reader electronics 24 as illustrated by block 154 in FIG. 3 until card data 13 has been read from a proximity card 12, or has not been read from some other object, by the reader electronics 24 and, if card data has been read, it is transmitted 36 to the access control electronics 22 as illustrated by block 156. If card data 13 has been read and transmitted to the access control electronics 22, power is removed from the reader electronics 24 as illustrated by block 158 and the electrical current consumption shown in FIG. 2 returns to the card-detected level 150.

Because the access control electronics 22 were enabled at block 150 in FIG. 3, the access control electronics 22 begin processing the card-data signal 36 as soon as the card-data signal 36 is received by the access control electronics 22 (which, as discussed above, occurred at block 156). However, because it takes some time for the access control electronics 22 to process the card-data signal 36, the reader electronics 24 are shut down by block 158 before the access control electronics 22 are capable of sending the unlock/re-lock signal 34 to the locking mechanism 14 as illustrated in FIG. 1. As a result, the electrical current consumption remains at the card-detected level 150 after the reader electronics 24 are shut down (due to block 158) and until the card-data signal 36 is processed by the access control electronics 22 to send the unlock/re-lock signal 34. This prevents the reader electronics 24 from being powered up at the same time the unlock/re-lock signal 34 is given, which otherwise could result in a significant spike in current consumption.

Once the access control electronics 22 process the card-data signal 36, the unlock/re-lock signal 34 is sent to the locking mechanism 14 if the access control electronics 22 determined from the card data 13 that entry is authorized. If the unlock/re-lock signal 34 is sent, the electrical current consumption jumps from the card-detected level 150 to a unlocking/re-locking level 160 as shown in FIG. 2. After the locking mechanism 14 is unlocked, the current consumption returns to the card-detected level 150 illustrated in FIG. 2. The current consumption remains at this level for a predetermined amount of time before the unlock/re-lock signal 34 is again sent to the locking mechanism 14 to re-lock it. When the locking mechanism 14 is instructed to re-lock, the current consumption again jumps from the card-detected level 150 to the unlocking/re-locking level 160. After the locking mechanism 14 is re-locked, the access control electronics 22 shut down and the current consumption returns to the card-detection-function level 126 illustrated in FIG. 2.

The current consumption remains at the card-detection-function level 126 (before returning to the low-power level 120) because, as illustrated in FIG. 3, after power is removed from the reader electronics 24 at block 158, the wake-up circuit 26 re-enters the card detection function (FIG. 4) as illustrated by block 162. In addition, the current consumption remains at this level until the card 12 is no longer detected by the card detection function 162. In other words, following the card detection function 162, the wake-up circuit 26 checks to see if the proximity card 12 has been removed from its infrared reflecting orientation as illustrated by block 164. If the proximity card 12 has not been removed from its infrared reflecting orientation, this loop between blocks 162 and 164 continues until the proximity card 12 is removed. In other words, the loop continues until the card detection function 162 returns a value that no proximity card 12 is detected—see block 138 in FIG. 4.

The purpose of this loop between blocks 162 and 164 is to prevent unnecessary power consumption that could result from someone tampering with, or using improperly, the proximity card detection system 10. For example, if the loop 162–164 were not present and, if someone were to continue to hold a proximity card 12 in front of the proximity card detection system 10, the proximity card detection system 10 would continually cycle through the current consumption graph illustrated in FIG. 2 (based on the discussion of FIGS. 3 and 4 above) even though the person presenting the proximity card 12 had already gained access past locking mechanism 14. Similarly, unnecessary power consumption could result if someone put tape over the emitter 40 and detector 42 so that energy 45 would always be reflected and detected. In this case, although the locking mechanism 14 would not be unlocked or re-locked because the card-data signal 36 would not authorize the unlock/re-lock signal 34 to be sent by the access control electronics 22, the reader-electronics-activated level 154 of current consumption illustrated in FIG. 2 would continually be reached because blocks 120–158 in FIG. 3 would continue to be processed. Thus, by requiring the card 12 to be removed from its infrared reflecting orientation illustrated by blocks 162 and 164, the wake-up circuit 26 prevents the proximity card detection system 10 from continually cycling through the current consumption graph illustrated in FIG. 2 when it is unnecessary to do so. Instead, after the locking mechanism 14 is unlocked and then re-locked, the card 12 must be removed from its infrared reflecting orientation before the wake-up circuit 26 will continue through the main loop illustrated in FIG. 3.

Once the proximity card 12 has been removed from its infrared reflecting orientation as required by block 164 in FIG. 3, the wake-up circuit 26 checks to see if the access control electronics 22 have been shut down as illustrated by block 166. The wake-up circuit 26 waits until the access control electronics have been shut down, as indicated by a "NO" exiting from block 166. As mentioned above, in the "passage mode" condition, the access control electronics 22 automatically shut down after the locking mechanism 14 is re-locked. Therefore, in this condition, after the proximity card 12 has been removed from infrared reflecting orientation, as required by block 164, the access control electronics 22 are shut down, a "YES" exits from block 166, and the wake-up circuit 26 returns to the low-power state as illustrated by block 120 in FIG. 3. The loop then continues as previously described.

In the second example, in which the ambient light 16 does contain sufficient infrared energy to be detected by wake-up circuit 26, the proximity card detection system 10 begins in a low power state, as illustrated at block 120 in FIG. 3, where the wake-up circuit 26, the reader electronics 24, and the access control electronics 22 are effectively powered down. The wake-up circuit 26 then progresses through the 250 millisecond time delay of block 122, exits the low power state as illustrated by block 124, and enters the card detection function at block 126 in exactly the same manner as described in the first example.

Referring to the card detection function 126 in FIG. 4, the wake-up circuit 26 then checks to see if infra-red energy is detected by detector 42 as illustrated by block 128. As in the first example, the card detection function 126 of FIG. 4 involves the absence-presence-absence algorithm. However, when there is sufficient infra-red energy in the ambient light 16, the movement of the proximity card 12 in relation to the emitter 40 and detector 42 alters the practical application of the absence-presence-absence algorithm. For example, because the ambient light 16 does contain sufficient infra-red energy, a "YES" will exit from block 128 when no card 12 is present and the card detection function 126 will return a signal, as illustrated by block 138, that no proximity card 12 or other reflective object was detected. Referring back to FIG. 3, this results in a "NO" exiting from block 148 so that the wake-up circuit 26 returns to the low power state at block 120 and repeats this loop until sufficient infra-red energy is not detected at block 128 in FIG. 4.

In order for infra-red energy not to be detected at block 128 in FIG. 4 (and satisfy the first "absence" requirement) when infra-red energy is being emitted from the ambient light 16, a proximity card 12 or other infra-red blocking object must be positioned between the ambient light 16 and the detector 42 as illustrated in FIG. 1 to block the ambient infra-red energy 16 from being detected by the detector 42. When this occurs, a "NO" will exit from block 128 in FIG. 4 and the first "absence" requirement of the "absence-presence-absence" algorithm will be satisfied.

After the first "absence" requirement has been satisfied, the infra-red emitter 40 is turned on as illustrated by block 130 in FIG. 4 to probe for the "presence" of reflected infra-red energy. As in the first example, assuming that the proximity card 12 remains in the position illustrated in FIG. 1, when the emitter 40 is activated, the infra-red energy 45 is reflected back towards the detector 42. If the proximity card 12 remains present, at some time before the 50 microsecond delay of block 132, infra-red energy will be detected at block 134 and a "YES" will exit from block 134 indicating that the "presence" requirement has also been satisfied.

If, however, immediately after the infra-red emitter is turned on at block 130, the proximity card 12 is removed, infra-red energy will still be detected at block 134 because the infrared energy in the ambient light 16 will be detected by detector 42. However, in this case, where the proximity card 12 is removed at some time between blocks 130 and 140 in FIG. 4, the final "absence" requirement as required by block 144 in FIG. 4 will prevent the card detection function 126 from concluding that a card has been detected. This is so because if the proximity card 12 has been removed, infra-red energy will continue to be detected, even at block 144. Thus, even though the "presence" of infra-red energy required by block 134 will almost always be satisfied when the ambient light 16 contains sufficient infra-red energy, the two "absence" requirements of blocks 128 and 144 prevent the card detection function 126 from being tricked into believing that a proximity card 12 is present when in fact it is not.

Assuming, however, that the proximity card 12 is being properly presented to the proximity card detection system 10, the wake-up circuit 26 will deactivate the infra-red emitter 40 as illustrated by block 140 after infra-red energy has been detected at block 134. The wake-up circuit 26 then waits for 100 microseconds as illustrated by block 142 before probing for the final "absence" requirement as illustrated by block 144. With the proximity card 12 remaining between the ambient light 16 and the detector 42, infra-red energy will not be detected when the emitter 40 is turned off because the proximity card 12 will be blocking the infra-red energy from the ambient light 16. Thus, the final "absence" requirement will be met and the card detection function 126 will return a value that a card has been detected as illustrated by block 146.

Referring back to FIG. 3, a "YES" will exit from block 148 and the access control electronics 22 will be turned on as illustrated by block 150. The remaining blocks 150–166 will operate as discussed in the first example except that the card detection function illustrated at block 162 will operate as just described with reference to ambient light 16 that does contain infra-red energy. The above discussion of the operation of blocks 152-166 is incorporated by reference here.

Figure 5:
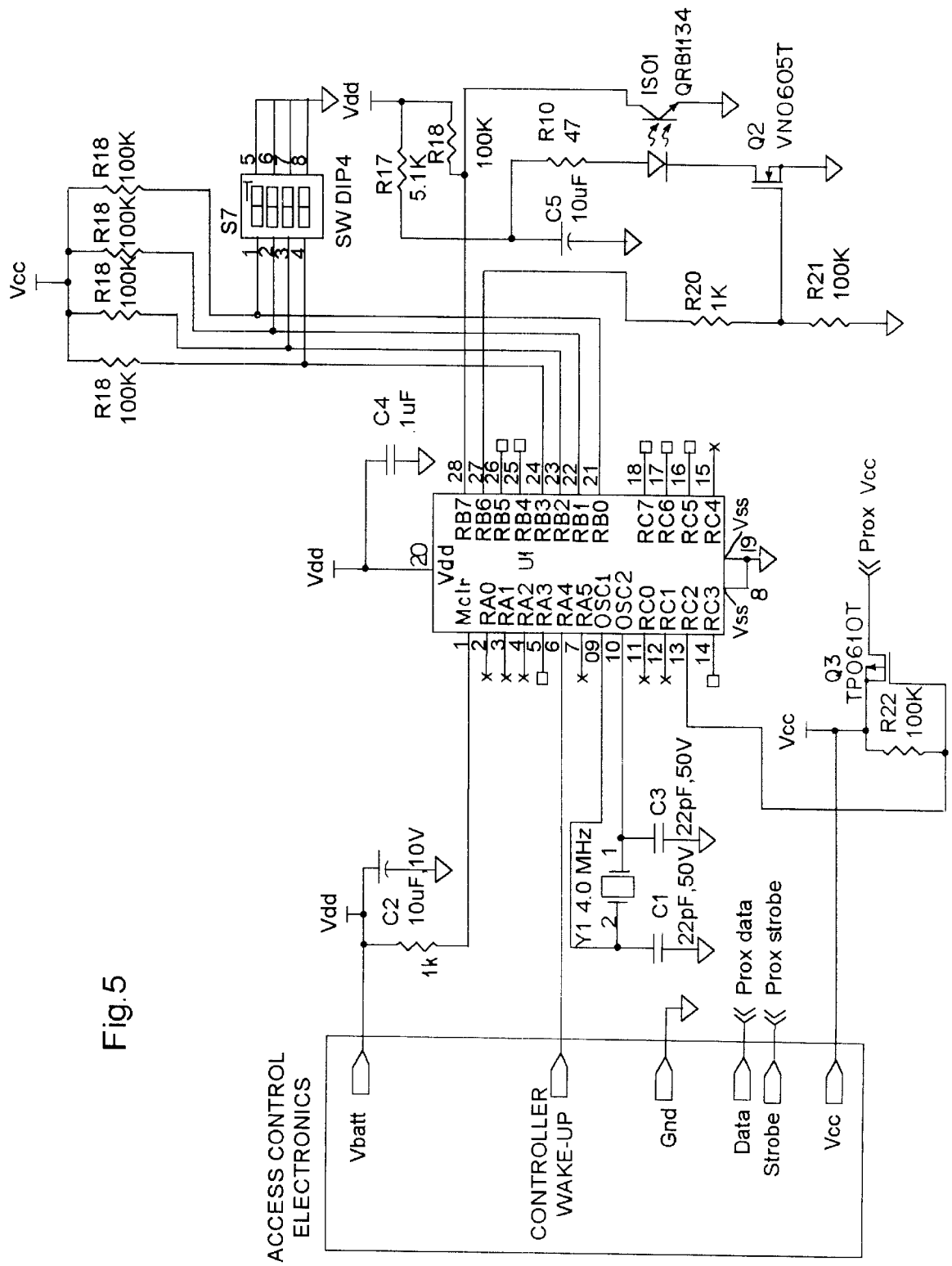
FIG. 5 illustrates a schematic diagram of a circuit realization of the proximity card detection system illustrated in FIG. 1.

FIG. 5 is a schematic diagram illustrating a circuit realization of the wake-up circuit 26. Battery voltage $V_{batt}$ is provided from the power source 20. System GrouND and regulated power $V_{cc}$ for the reader electronics 24 illustrated in FIG. 1 are provided through the access control electronics 22 to the wake-up circuit 26. Access control electronics 22 receive from wake-up circuit 26 a Controller Wake-Up signal 47. Access control electronics 22 also receive Proximity card Data 36 from card 12 illustrated in FIG. 1 in response to a Proximity card Strobe. $V_{batt}$, which is also the system $V_{dd}$ supply, is coupled across a 10 μF, 10 V capacitor to the wake-up circuit ground and through a 1 KΩ resistor to a notMasterCLeaR terminal, pin 1, of a microcontroller (μC) 170. Power is coupled to the $V_{dd}$ terminal, pin 20, of μC 170. An oscillator comprising a 4 MHz crystal is coupled across the OSCillator1 and Osc2 terminals, pins 9 and 10, respectively, of μC 170. A 22 pF capacitor is coupled between each of these terminals and ground. The system $V_{dd}$ supply is coupled through a 100 KΩ resistor to the collector of an IR detector phototransistor 42, the emitter of which is coupled to ground. System $V_{dd}$ is also coupled through a 5.1 KΩ resistor 174 and a 10 μF capacitor 176 to ground. The junction of resistor 174 and capacitor 176 is coupled through a 47 Ω resistor to the anode of an IR LED 40. The cathode of LED 40 is coupled to the drain terminal of an FET 180. The source terminal of FET 180 is coupled to ground, and its gate is coupled through a 1 KΩ resistor to terminal RB6, pin 27, of μC 170 and through a 100 KΩ resistor to ground. The RB0–RB3 terminals of μC 170 are coupled through respective 100 KΩ resistors to the system $V_{cc}$ supply, and to respective terminals 1–4 of a four switch DIP switch package 182. Terminals 5–8 of switch 182 are coupled to ground. Switch 182 permits the time delay indicated in block 122 of FIG. 3 to be changed from 250 msec to, for example, 125 msec, 500 msec or 1000 msec. The drain of an FET 48 is coupled to $V_{cc}$ and its source is coupled to the reader electronics 24. The gate of FET 48 is coupled to terminal RC2, pin 13, of μC 170 and through a 100 KΩ resistor to $V_{cc}$. The controller electronics 22 receives a wake-up signal from terminal RA4, pin 6, of μC 170. When terminal RB6 of μC 170 is high, emitter 40 emits infrared radiation fordetector 42 to detect or not detect, depending upon whether or not a card 12 is positioned to reflect the radiation from emitter 40 back to detector 42.

The supply of operating power to the card reader electronics 24 from terminal $V_{cc}$ is controlled from terminal RC2 of μC 170. When terminal RC2 is low, power is supplied from terminal $V_{cc}$ through the drain and source of FET 48 to the Proximity card $V_{cc}$ supply terminal 32 of the reader electronics 24. Illustratively, μC 170 is a Microchip Technology Inc., type PIC16C62 μC, emitter 40 and detector 42 are a type QRB1134 isolator, FET 180 is a type VN0605T FET, and FET 48 is a type TP0610T FET.

Figure 6:
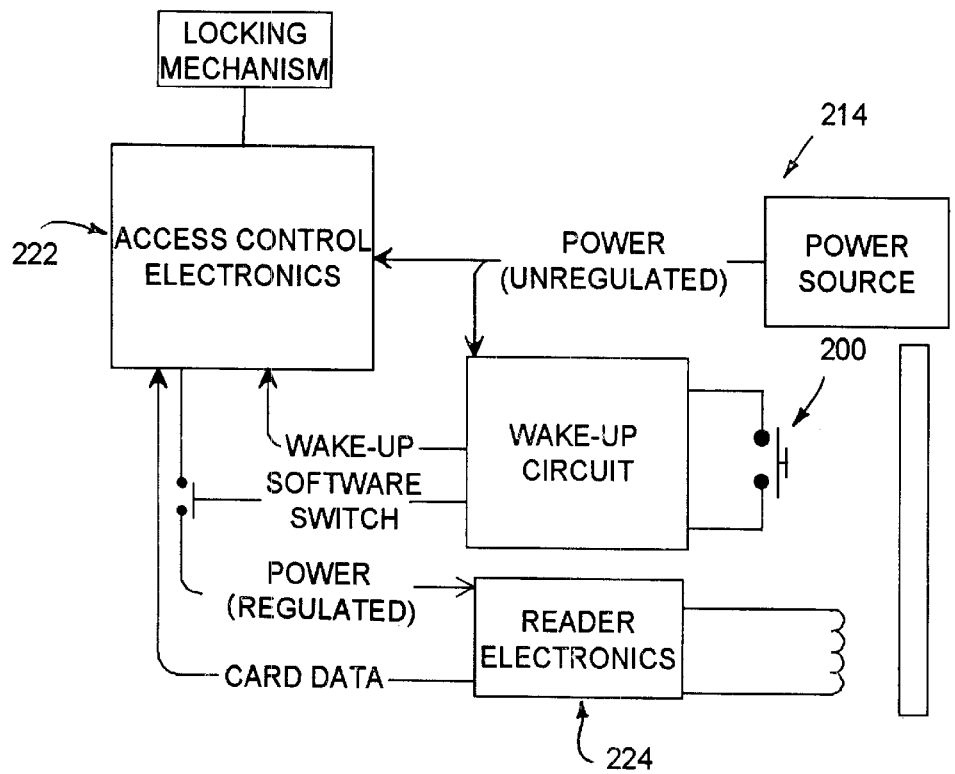
FIG. 6 illustrates a fragmentary block diagram of another system constructed according to the present invention.

While IR detection has been discussed thus far, IR detection is not the only way that low power proximity detection can be implemented. Another simple technique is for the user seeking access to close a switch, causing power to be supplied to the detector for a short time during which the user can present his or her card to seek access. In an illustrative system, a fragment of which is illustrated in FIG. 6, a switch 200 is provided on a locking device 214. When a user wishes to gain access, he or she changes the state of the switch 200. Activation of the switch 200 is sensed by the access control electronics 222, which then causes power to be applied to the proximity card reader 224. This is similar to the method used for magnetic card readers in stand-alone applications.

Figure 7:
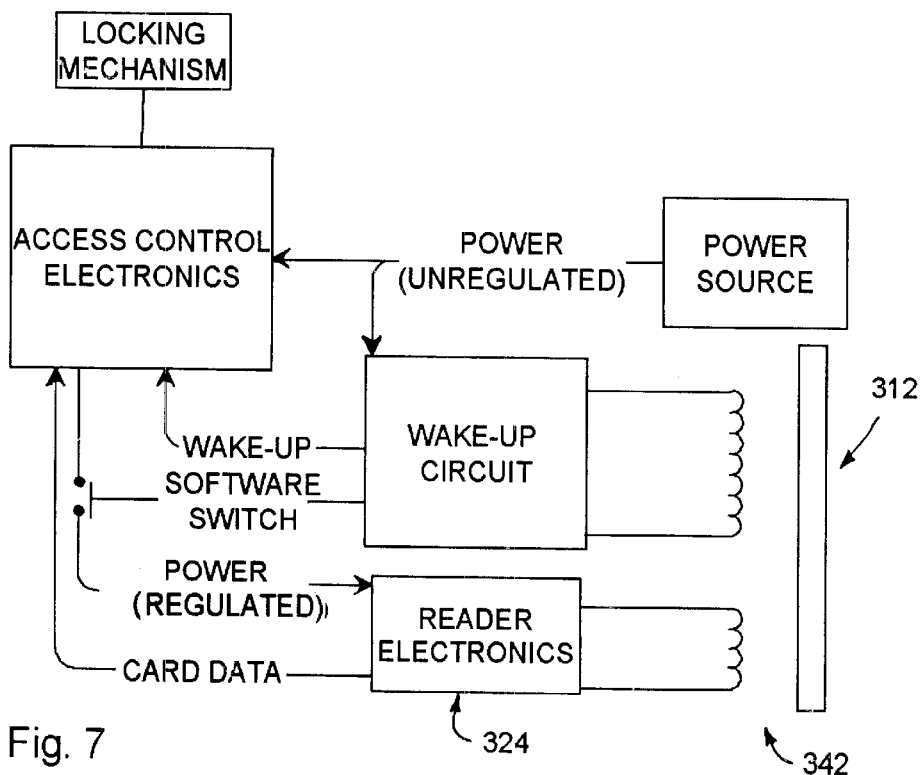
FIG. 7 illustrates a fragmentary block diagram of another system constructed according to the present invention.

Referring to FIG. 7, inductive techniques, in which coils, for example, are incorporated into a card 312 and the card detector 342. These coils are inductively coupled by bringing the card 312 into close proximity to the card detector 342's coils. This may also be used to cause power to be supplied to the detector 342 for a short time to interrogate the user's card 312 and determine whether access is to be permitted. Proximity cards 312 and proximity card readers 324 essentially comprise a transformer with an air core. The proximity card reader 324 comprises the primary of such a transformer, and the proximity card 312 the secondary. When the cardholder wishes to transfer data to the reader 324, such as when he or she is seeking entry past the card reader 324, he or she places his or her card 312 in close proximity to the card reader 324, the transformer primary. This changes the loading on the secondary of the transformer, in the card 312. This change in loading is sensed by the transformer primary in the reader 324, and the access data is then transmitted, received and sensed.

Figure 8:
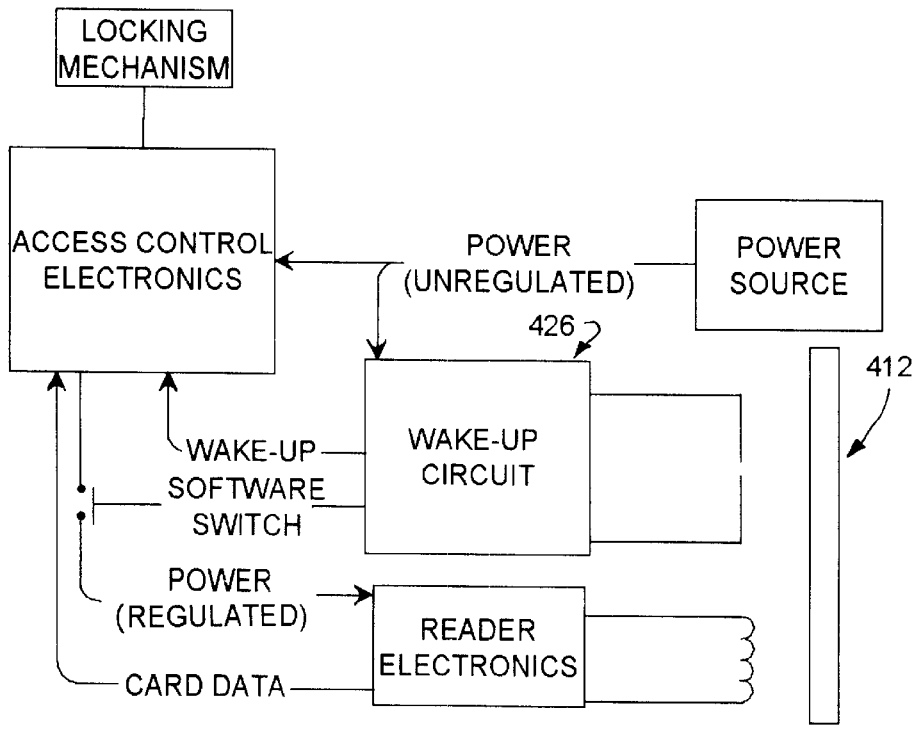
FIG. 8 illustrates a fragmentary block diagram of another system constructed according to the present invention; and, FIG. 9 illustrates a fragmentary block diagram of another system constructed according to the present invention.

Capacitive techniques for implementing low power card detection and access determinations include charge transfer techniques, sometimes called "QT" techniques, and tuned circuit techniques. A description of an illustrative QT technique is contained in Philipp, H., "Charge Transfer Sensor Technology Provides a New Family of Sensors," Electronic Engineering (UK), vol. 69, no. 845, May, 1997, pp. 28–31. A circuit useful in implementing a QT technique for proximity detection is described in "QPROX™QT9701 Charge-Transfer Capacitance Sensor IC," Quantum Research Group Ltd., 1997, pp. 1–20. Both of these documents are incorporated herein by reference. Very briefly, and with reference to FIG. 8, in the simplest such systems, any object, such as a card 412, presented to wake-up circuit 426 presents a variable capacitance to ground. The wake-up circuit 426 contains a circuit having a known capacitance and a voltage source having a known magnitude. From these parameters, the object's capacitance can be ascertained. The wake-up circuit then also contains circuitry for determining whether the ascertained capacitance is enough to establish the presence of the card 412.

Figure 9:
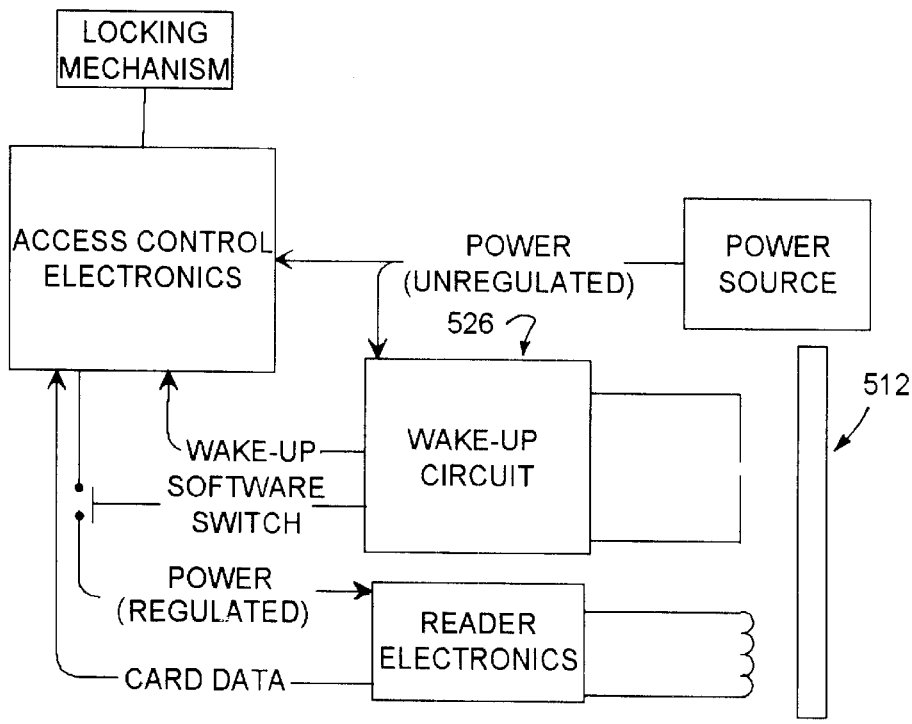

A description of a method for implementing proximity sensing using tuned circuit techniques is illustrated in Baxter, L. K., Chapter 17, "Proximity Detector," Capacitive Sensors, IEEE Press, 1997, pp. 236–242. This explanation is also incorporated herein by reference. Again very briefly, and with reference to FIG. 9, in the simplest such systems, any object, such as a card 512, presented to wake-up circuit 526 presents a variable capacitance to ground. The wake-up circuit 526 contains a circuit having a known capacitance. From this, the object's capacitance can be ascertained. The wake-up circuit then also contains circuitry for determining whether the ascertained capacitance is enough to establish the presence of the card 512.

What is claimed is:

1. A security system comprising
   a card containing access information,
   a locking mechanism,
   a circuit coupled to the locking mechanism to operate the locking mechanism if the access information is read by the circuit, the circuit being configured to read the access information contained on the card after the circuit detects first the absence of electromagnetic energy, then the presence of intermittent electromagnetic energy, then the absence of intermittent electromagnetic energy during a preset period of the card being hold adjacent the circuit; and
   the circuit being configured to determine an amount of time that elapses between detecting the absence of electromagnetic energy and detecting the presence of the intermittent electromagnetic energy and between detecting the presence of the intermittent electromagnetic energy and detecting the absence of the intermittent electromagnetic energy.

2. The security system of claim 1 wherein the circuit includes a power portion, a wake-up portion, and a reader portion, the wake-up portion has a first amount of current draw from the power portion when the wake-up portion detects the presence and absence of electromagnetic energy, the reader portion has a second amount of current draw from the power portion when the reader portion reads the access information, and the second amount of current draw is greater than the first amount of current draw.

3. The security system of claim 1 wherein the circuit includes a capacitive read head.

4. The security system of claim 1 wherein the circuit includes an inductive read head.

5. The security system of claim 1 wherein the circuit includes a read head that senses electrical charge.

6. The security system of claim 1 wherein the circuit includes reader electronics, a wake-up circuit portion, a power source, a switch having a first state in which the power source is coupled to the reader electronics, and a second state in which the power source is not coupled to the reader electronics, the wake-up circuit switching the switch from the second state to the first state when the wake-up circuit detects the presence of the card.

7. The security system of claim 1 wherein the circuit configured to detect first the absence of electromagnetic energy, then the presence of electromagnetic energy, then the absence of electromagnetic energy includes a circuit configured to detect first the absence of infrared energy, then the presence of infrared energy, then the absence of infrared energy.

8. The security system of claim 1 wherein the circuit configured to detect first the absence of electromagnetic energy, then the presence of electromagnetic energy, then the absence of electromagnetic energy includes a circuit configured to detect first the absence of ultrasonic energy, then the presence of ultrasonic energy, then the absence of ultrasonic energy.

9. The security system of claim 1 wherein the circuit configured to detect first the absence of electromagnetic energy, then the presence of electromagnetic energy, then the absence of electromagnetic energy includes a circuit configured to detect first absence of a magnetic field, then the presence of a magnetic field, then the absence of a magnetic field.

10. The security system of claim 1 wherein the circuit includes an emitter that emits electromagnetic energy at least intermittently, the card being configured to reflect the electromagnetic energy emitted by the emitter when the card is placed in a path of electromagnetic energy emitted by the emitter, and the circuit further includes a detector that is configured to detect the reflected electromagnetic energy.

11. A security system for locking and unlocking a door, the security system comprising a card containing access information, a locking mechanism associated with the door, a reader that, when activated, can read access information contained on the card, access control electronics that, when activated, can receive access information read by the reader and process the received access information to determine if the received access information is valid, the access control electronics being configured to signal the locking mechanism to unlock the door if the received access information is valid, and a wake-up circuit configured to detect the proximal presence of the card and, if the wake-up circuit detects the presence of the card, to activate the access control electronics and the reader, the wake-up circuit including an emitter that emits electromagnetic energy at least intermittently and a detector that detects intermittent electromagnetic energy reflected by the card, the wake-up circuit detecting the presence of the card by sensing with the detector that electromagnetic energy first was absent, then reflected intermittent electromagnetic energy was present, then the intermittent electromagnetic energy was absent again during a preset period of the card being adjacent the detector.

12. The security system of claim 11 further comprising a power source, the wake-up circuit drawing a first current from the power source when the wake-up circuit operates, the reader drawing a second current from the power source when the reader operates, the first current having a smaller magnitude than the second current.

13. The security system of claim 12 wherein the access control electronics draws a third current from the power source when the access control electronics operates, the third current having a larger magnitude than the first current, and the third current having a smaller magnitude than the second current.

14. The security system of claim 13 wherein the locking mechanism draws a fourth current from the power source to unlock the door, the fourth current having a larger magnitude than each of the first, second, and third currents.

15. The security system of claim 11 wherein the reader includes a capacitive read head.

16. The security system of claim 11 wherein the reader includes an inductive read head.

17. The security system of claim 11 wherein the reader includes a read head that senses electrical charge.

18. The security system of claim 11 further comprising a power source and a switch, the switch having a first state in which the power source is coupled to the reader and a second state in which the power source is not coupled to the reader, the wake-up circuit switching the switch between the first and second states.

19. The security system of claim 11 wherein the emitter that emits electromagnetic energy and the detector that detects electromagnetic energy comprise an emitter that emits infrared energy and a detector that detects infrared energy.

20. The security system of claim 11 wherein the emitter that emits electromagnetic energy and the detector that detects electromagnetic energy comprise an emitter that emits ultrasonic energy and a detector that detects ultrasonic energy.

21. The security system of claim 11 wherein the emitter that emits electromagnetic energy and the detector that detects electromagnetic energy comprise an emitter that generates a magnetic field and a detector that detects a magnetic field.

22. The security system of claim 11 wherein the wake-up circuit is configured to determine an amount of time that elapses between detecting the absence of electromagnetic energy and detecting the presence of the reflected intermittent electromagnetic energy.

23. The security system of claim 11 wherein the wake-up circuit is configured to determine an amount of time that elapses between detecting the presence of the reflected intermittent electromagnetic energy and detecting the absence of the reflected intermittent electromagnetic energy.

24. A security system comprising a locking mechanism of a door, a card containing access information, a power source, reader electronics configured to read the access information contained on the card, the reader electronics normally being powered down, access control electronics configured to process the information that is contained on the card and that is read by the reader electronics, the access control electronics being configured to signal the locking mechanism to unlock the door when the information read by the reader electronics is determined by the access control electronics to be valid, the access control electronics normally being powered down, and a wake-up circuit configured to detect the presence of the card, the power source being coupled to the wake-up circuit to provide power to the wake-up circuit, the wake-up circuit being coupled to the reader electronics and to the access control electronics, the wake-up circuit being configured to power up the reader electronics to read the card after the wake-up circuit detects the presence of the card, the wake-up circuit being configured to power up the access control electronics to receive the access information read by the reader electronics and to process the access information after the wake-up circuit detects the presence of the card, the wake-up circuit having a proximal detector configured to detect intermittent electromagnetic energy, the wake-up circuit being configured to power up the reader electronics and the access control electronics after the wake-up circuit determines (i) that electromagnetic energy was absent at the detector at a first time, (ii) that intermittent electromagnetic energy was present at the detector at a second time after the first time, and (iii) that intermittent electromagnetic energy was absent at the detector at a third time after the second time during a preset period of the card being adjacent the detector.

25. The security system of claim 24 wherein the wake-up circuit comprises an emitter that the intermittently emits electromagnetic energy and the intermittent electromagnetic energy detected by the detector is the intermittent electromagnetic energy that is reflected by the card.

26. The security system of claim 25 wherein the emitter comprises an infrared emitter and the detector comprises an infrared detector.

27. The security system of claim 24 wherein the wake-up circuit is configured to determine an amount of time that elapses between the first time and the second time.

28. The security system of claim 24 wherein the wake-up circuit is configured to determine an amount of time that elapses between the second time and the third time.

29. The security system of claim 24 wherein the detector configured to detect electromagnetic energy comprises a detector configured to detect infrared energy.

30. The security system of claim 24 wherein the detector configured to detect electromagnetic energy comprises a detector configured to detect ultrasonic energy.

31. The security system of claim 24 wherein the detector configured to detect electromagnetic energy comprises a detector configured to detect a magnetic field.

32. A method for operating a security system to unlock a door, the method comprising:

emitting intermittent electromagnetic energy from an emitter, detecting a first absence of electromagnetic energy with a proximity detector capable of sensing the presence and absence of electromagnetic energy during a preset period of an access card being adjacent the detector, detecting a presence of intermittent electromagnetic energy with the detector, detecting a second absence of the intermittent electromagnetic energy with the detector, supplying power from a power source to a reader after detecting the sequence above of the absence, presence and absence of electromagnetic energy with the detector to enable the reader to read access information contained on the access card selectively oriented in proximity to the reader, supplying power from the power source to an access control circuit after detecting the sequence above of the absence, presence and absence of electromagnetic energy with the detector to enable the access control circuit to receive from the reader access information read by the reader and to process the access information to determine whether the access information is valid, and sending a signal from the circuit to a locking mechanism to unlock the door when the access information on the card is determined to be valid by the access control circuit.

33. The method of claim 32 wherein emitting electromagnetic energy comprises emitting infrared energy.

34. The method of claim 32 wherein emitting electromagnetic energy comprises emitting ultrasonic energy.

35. The method of claim 32 wherein emitting electromagnetic energy comprises creating a magnetic field.

36. The method of claim 32 wherein detecting the presence of intermittent electromagnetic energy with the detector comprises detecting intermittent electromagnetic energy reflected by the access card.

37. The method of claim 32 wherein detecting the presence of electromagnetic energy with the detector comprises detecting infrared energy.

38. The method of claim 32 wherein detecting the presence of electromagnetic energy with the detector comprises detecting ultrasonic energy.

39. The method of claim 32 wherein detecting the presence of electromagnetic energy with the detector comprises detecting a magnetic field.

40. The method of claim 32 wherein supplying power from the power source to the access control occurs before supplying power to the reader.

41. The method of claim 32 further comprising determining time that elapses between detecting the first absence of electromagnetic energy and the detecting the presence of the intermittent electromagnetic energy.

42. The method of claim 32 further comprising determining time that elapses between detecting the presence of the intermittent electromagnetic energy and the detecting the second absence of the intermittent electromagnetic energy.

43. A security system for locking and unlocking a door, the security system comprising a card containing access information, a locking mechanism associated with the door, a reader that, when activated, reads the access information contained on the card, a first circuit that, when activated, receives the access information read by the reader and processes the access information to determine if the access information is valid, the first circuit being configured to signal the locking mechanism to unlock the door if the access information is valid, and a wake-up circuit configured to detect the proximal presence of the card, the wake-up circuit being configured to activate the reader and to activate the first circuit if the wake-up circuit detects the presence of the card, the wake-up circuit detecting the presence of the card by sensing a first absence of electromagnetic energy, then sensing a presence of intermittent electromagnetic energy after sensing the first absence of electromagnetic energy, then sensing a second absence of the intermittent electromagnetic energy after sensing the presence of the intermittent electromagnetic energy during a preset period of the card being adjacent the wake-up circuit.

44. The security system of claim 43, further comprising a power source and a switch, the switch coupling the power source to the reader, and the switch being coupled to the wake-up circuit to be controlled by the wake-up circuit.

45. The security system of claim 43, wherein the wake-up circuit comprises an emitter of electromagnetic energy.

46. The security system of claim 45, wherein the emitter emits infrared energy.

47. The security system of claim 45, wherein the emitter emits ultrasonic energy.

48. The security system of claim 45, wherein the emitter emits a magnetic field.

49. The security system of claim 43, wherein the electromagnetic energy detected by the wake-up circuit comprises infrared energy.

50. The security system of claim 43, wherein the electromagnetic energy detected by the wake-up circuit comprises ultrasonic energy.

51. The security system of claim 43, wherein the electromagnetic energy detected by the wake-up circuit comprises a magnetic field.

52. The security system of claim 43, wherein the reader has a sensor to sense changes in capacitance and the reader uses the sensor to read the access information from the card.

53. The security system of claim 43, wherein the reader has a sensor to sense changes in inductance and the reader uses the sensor to read the access information from the card.

54. The security system of claim 43, wherein the reader has a sensor to sense changes in electrical charge and the reader uses the sensor to read the access information from the card.

55. The security system of claim 43, wherein the wake-up circuit is determine an amount of time that elapses between sensing the first absence of electromagnetic energy and sensing the presence of the intermittent electromagnetic energy.

56. The security system of claim 43, wherein the wake-up circuit is configure to determine an amount of time that elapses between sensing the presence of the intermittent electromagnetic energy and sensing the second absence of the intermittent electromagnetic energy.

57. The security system of claim 43, wherein the electromagnetic energy sensed by the wake-up circuit includes intermittent electromagnetic energy emitted by the wake-up circuit and reflected back to the wake-up circuit by the card.

* * * * *